(12) United States Patent
Lee et al.

(10) Patent No.: US 6,656,845 B2
(45) Date of Patent: Dec. 2, 2003

(54) METHOD FOR FORMING SEMICONDUCTOR SUBSTRATE WITH CONVEX SHAPED ACTIVE REGION

(75) Inventors: Hsin Yi Lee, Hsin-Chu (TW); Yin-Pin Wang, Koshing (TW)

(73) Assignee: Taiwan SEmiconductor Manufacturing Co., Ltd, Hsin Chu (TW)

( * ) Notice: Subject to any disclaimer, the term of this patent is extended or adjusted under 35 U.S.C. 154(b) by 45 days.

(21) Appl. No.: 10/077,619

(22) Filed: Feb. 15, 2002

(65) Prior Publication Data

US 2003/0157759 A1 Aug. 21, 2003

(51) Int. Cl.[7] .............................................. H01L 21/311
(52) U.S. Cl. ........................ 438/700; 438/701; 438/740; 257/153; 257/329
(58) Field of Search ................................ 438/675, 631, 438/697, 699, 700, 701, 740; 257/153, 329

(56) References Cited

U.S. PATENT DOCUMENTS

| | | | |
|---|---|---|---|
| 4,512,073 A | * | 4/1985 | Hsu ........................... 257/771 |
| 4,689,872 A | * | 9/1987 | Appels et al. ..... 148/DIG. 103 |
| 4,965,648 A | * | 10/1990 | Yang et al. .................. 257/221 |
| 5,262,337 A | | 11/1993 | Kim |
| 5,292,680 A | | 3/1994 | Lur et al. |
| 5,382,538 A | * | 1/1995 | Zambrano et al. . 148/DIG. 126 |
| 5,731,604 A | * | 3/1998 | Kinzer .......................... 257/153 |
| 5,795,793 A | * | 8/1998 | Kinzer .......................... 438/307 |
| 5,907,169 A | * | 5/1999 | Hshieh et al. ............... 257/262 |
| 5,981,354 A | * | 11/1999 | Spikes et al. ................ 438/424 |
| 6,005,375 A | * | 12/1999 | van Saders et al. .......... 323/273 |
| 6,110,827 A | * | 8/2000 | Chien et al. ................. 438/631 |
| 6,153,454 A | | 11/2000 | Krivokapic |
| 6,259,135 B1 | * | 7/2001 | Hsu et al. .................... 257/331 |
| 6,287,904 B1 | * | 9/2001 | Lee et al. .................... 438/197 |
| 2002/0020890 A1 | * | 2/2002 | Willer ........................ 257/390 |

OTHER PUBLICATIONS

Peter Van Zant, "Microchip Fabrication", 4 th Edition, McGraw–Hill pp. 605, 607–608.*

* cited by examiner

Primary Examiner—Wael Fahmy, Jr.
Assistant Examiner—Shrinivas H Rao
(74) Attorney, Agent, or Firm—Tung & Associates

(57) ABSTRACT

Within a method for fabricating a semiconductor substrate while employing formed thereover a mask layer there is first employed the mask layer as an etch mask layer for forming a pair of isolation trenches within the semiconductor substrate and then laterally etched the mask layer prior to employing the laterally etched mask layer as an oxidation mask layer. By laterally etching the mask layer, there is formed within the semiconductor substrate a continuously curved convex elevated region as an active region of the semiconductor substrate.

18 Claims, 3 Drawing Sheets

METHOD FOR FORMING SEMICONDUCTOR SUBSTRATE WITH CONVEX SHAPED ACTIVE REGION

BACKGROUND OF THE INVENTION

1. Field of the Invention

The present invention relates generally to methods for forming semiconductor integrated circuit microelectronic fabrications. More particularly, the present invention relates to methods for forming, with enhanced performance, semiconductor integrated circuit microelectronic fabrications.

2. Description of the Related Art

Semiconductor integrated circuit microelectronic fabrications are formed from semiconductor substrates within and upon which are formed semiconductor devices and over which are formed patterned conductor layers which are separated by dielectric layers.

As semiconductor integrated circuit microelectronic fabrication integration levels have increased and semiconductor device dimensions have decreased, it has become increasingly important in the art of semiconductor integrated circuit microelectronic to form within semiconductor integrated circuit microelectronic fabrications semiconductor devices with enhanced performance.

While semiconductor devices with enhanced performance are clearly desirable in the art of semiconductor integrated circuit microelectronic fabrication and often essential in the art of semiconductor integrated circuit microelectronic fabrication, semiconductor devices with enhanced performance are nonetheless not always readily fabricated within the art of semiconductor integrated circuit microelectronic fabrication. In that regard, semiconductor devices are often difficult to fabricate with enhanced performance within the art of semiconductor integrated circuit microelectronic fabrication insofar as it is often inherent within various types of semiconductor devices that fabricating those semiconductor devices with decreased dimensions will compromise performance of those semiconductor devices.

It is thus desirable in the art of semiconductor integrated circuit microelectronic fabrication to fabricate semiconductor devices with enhanced performance.

It is towards the foregoing object that the present invention is directed.

Various methods have been disclosed within the art of semiconductor integrated circuit microelectronic fabrication for forming, with desirable properties, semiconductor devices within semiconductor integrated circuit microelectronic fabrications.

Included among the methods, but not limited among the methods, are methods disclosed within: (1) Kim, in U.S. Pat. No. 5,262,337 (a method for forming a metal oxide semiconductor field effect transistor (MOSFET) device absent a high horizontal electric field within a pair of lightly doped source/drain regions formed therein, by forming the metal oxide semiconductor field effect transistor (MOSFET) device within and upon a pillar within a semiconductor substrate whose pillar top comprises a channel region and whose pillar sidewalls comprise a pair of lightly doped source/drain regions, and wherein the pillar is surrounded by an "n" shaped gate electrode which in turn separates a pair of heavily doped source/drain regions formed within the semiconductor substrate adjacent the pillar); (2) Lur et al., in U.S. Pat. No. 5,292,680 (a method for forming a charge coupled device (CCD) with an enhanced transfer efficiency by forming the charge coupled device (CCD) with a series of gate electrodes formed upon a series of plateaus within a corrugated semiconductor substrate); and (3) Krivokapic, in U.S. Pat. No. 6,153,454 (a method for forming a metal oxide semiconductor field effect transistor (MOSFET) device with enhanced performance by forming the metal oxide semiconductor field effect transistor (MOSFET) device within a convex shaped semiconductor substrate such that a pair of source/drain regions slopes downwardly from a channel region within the metal oxide semiconductor field effect transistor (MOSFET)).

Desirable in the art of semiconductor integrated circuit microelectronic fabrication are additional methods and materials which may be employed in the art of semiconductor integrated circuit microelectronic fabrication for forming semiconductor devices with enhanced performance.

It is towards the foregoing object that the present invention is directed.

SUMMARY OF THE INVENTION

A first object of the present invention is to provide a method for forming a semiconductor device within a semiconductor integrated circuit microelectronic fabrication.

A second object of the present invention is to provide a method in accord with the first object of the present invention, wherein the semiconductor device is formed with enhanced performance.

A third object of the present invention is to provide a method in accord with the first object of the present invention and the second object of the present invention, wherein the method is readily commercially implemented.

In accord with the objects of the present invention, there is provided by the present invention a method for fabricating a semiconductor substrate.

To practice the method of the present invention, there is first providing a semiconductor substrate. There is then formed over the semiconductor substrate a mask layer. There is then etched the semiconductor substrate while employing the mask layer as an etch mask layer to form an elevated plateau within an etched semiconductor substrate which separates a pair of isolation trenches within the etched semiconductor substrate. There is then laterally etched the mask layer to form a laterally etched mask layer formed upon the elevated plateau and laterally recessed from the pair of isolation trenches. Finally, there is then thermally oxidized the etched semiconductor substrate while employing the laterally etched mask layer as an oxidation mask layer to form from the elevated plateau a continuously curved convex elevated region within a thermally oxidized etched semiconductor substrate.

Within the present invention, and incident to further processing of the thermally oxidized etched semiconductor substrate having formed therein the continuously curved convex elevated region, there may be formed a semiconductor device with enhanced performance insofar as the semiconductor device may be formed within and upon the continuously curved convex elevated region.

The present invention provides a method for forming a semiconductor device within a semiconductor integrated circuit microelectronic fabrication, wherein the semiconductor device is formed with enhanced performance.

The present invention realizes the foregoing object by forming within a semiconductor substrate a continuously curved convex elevated region such that the semiconductor device may be formed within and upon the continuously curved convex elevated region with the semiconductor substrate.

The method of the present invention is readily commercially implemented.

As will be illustrated in greater detail within the context of the Description of the Preferred Embodiment, as set forth below, the present invention employs methods and materials as are otherwise generally conventional in the art of semiconductor integrated circuit microelectronic fabrication, but employed within the context of a specific process ordering to provide the method of the present invention. Since it is thus at least in part a specific process ordering of a series of methods which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming a semiconductor device within a semiconductor integrated circuit microelectronic fabrication, wherein the semiconductor device is formed with enhanced performance.

The present invention realizes the foregoing object by forming within a semiconductor substrate a continuously curved convex elevated region such that the semiconductor device may be formed within and upon the continuously curved convex elevated region with the semiconductor substrate.

Referring now to FIG. 1 to FIG. 8, there is shown a series of schematic cross-sectional diagrams illustrating the results of progressive stages of forming, in accord with a preferred embodiment of the present invention, a series of field effect devices, such as a series of field effect transistor (FET) devices, within a semiconductor integrated circuit microelectronic fabrication.

Figure 1:
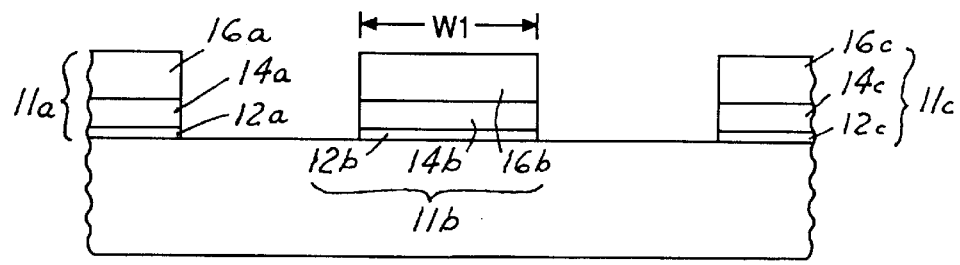
FIG. 1, FIG. 2, FIG. 3, FIG. 4, FIG. 5, FIG. 6, FIG. 7, FIG. 8 and FIG. 9 show a series of schematic cross-sectional and plan view diagrams illustrating the results of progressive stages of forming, in accord with a preferred embodiment of the present invention, a series of field effect devices, such as a series of field effect transistor (FET) devices, within a semiconductor integrated circuit microelectronic fabrication.

Shown in FIG. 1 is a schematic cross-sectional diagram of the semiconductor integrated circuit microelectronic fabrication at an early stage in its fabrication in accord with the preferred embodiment of the present invention.

Shown in FIG. 1 is a semiconductor substrate 10 having formed thereupon a series of trilayer stacks 11a, 11b and 11c comprising a series of patterned pad oxide layers 12a, 12b and 12c having formed aligned thereupon a series of patterned polysilicon buffer layers 14a, 14b and 14c in turn having formed aligned thereupon a series of patterned silicon nitride layers 16a, 16b and 16c.

Although the present invention may under certain circumstances at least theoretically be practiced with respect to semiconductor substrates including but not limited to silicon semiconductor substrates, germanium semiconductor substrates, silicon-germanium alloy semiconductor substrates and some compound (i.e., III-V, II-VI, I-VII) semiconductor substrates, for the preferred embodiment of the present invention, the semiconductor L substrate 10 is typically and preferably a silicon semiconductor substrate, more typically and preferably a (100) silicon semiconductor substrate. Similarly, within the preferred embodiment of the present invention each of the series of patterned pad oxide layers 12a, 12b and 12c, the series of patterned polysilicon buffer layers 14a, 14b and 14c and the series of patterned silicon nitride layers 16a, 16b and 16c is typically and preferably formed incident to patterning of a corresponding series of blanket layers which may otherwise also be formed employing methods and materials as are conventional in the art of semiconductor integrated circuit microelectronic fabrication.

For example, typically and preferably, the series of patterned pad oxide layers 12a, 12b and 12c is formed incident to patterning of a blanket pad oxide layer formed of a thermal silicon oxide dielectric material formed to a thickness of from about 100 to about 1000 angstroms upon the semiconductor substrate 10. In addition, typically and preferably, the series of patterned polysilicon buffer layers 14a, 14b and 14c is formed incident to patterning of a blanket polysilicon buffer layer formed to a thickness of from about 100 to about 1000 angstroms upon the blanket pad oxide layer. Finally, typically and preferably, the series of patterned silicon nitride layers 16a, 16b and 16c is formed incident to patterning of a blanket silicon nitride layer formed to a thickness of from about 100 to about 1000 angstroms upon the blanket polysilicon buffer layer.

As is understood by a person skilled in the art, the series of patterned polysilicon buffer layers 14a, 14b and 14c, and the series of patterned silicon nitride layers 16a, 16b and 16c, form in an aggregate a series of bilayer mask layers in accord with the present invention.

As is finally illustrated within the schematic cross-sectional diagram of FIG. 1, the trilayer stack 11b is formed of a linewidth W1, typically and preferably from about 0.3 to about 0.5 microns.

Figure 2:
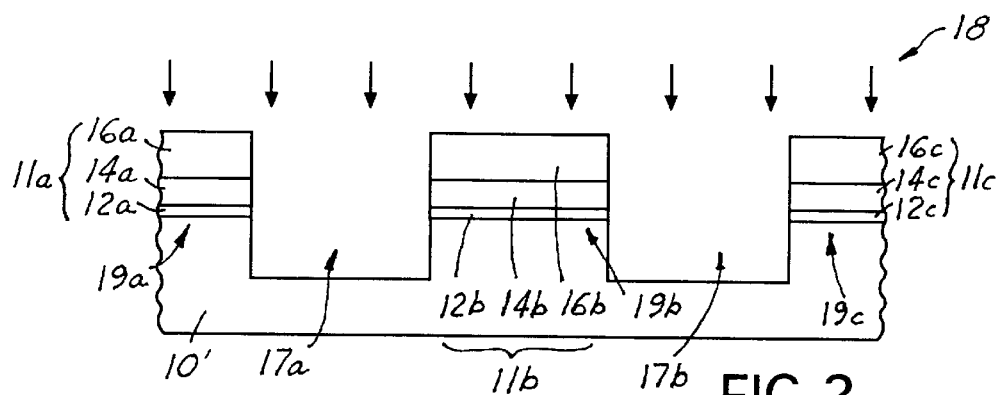

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein the semiconductor substrate 10 has been anisotropically etched with a first etching plasma 18, while employing the series of trilayer stacks 11a, 11b and 11c as etch mask layers, to form an etched semiconductor substrate 10' having formed therein a series of elevated plateaus 19a, 19b and 19c separated by a pair of isolation trenches 17a and 17b.

Within the preferred embodiment of the present invention, the first etching plasma 18 may be provided employing methods and materials as are conventional in the art of semiconductor integrated circuit microelectronic fabrication, and will typically and preferably employ a chlorine containing etchant gas composition for anisotropically etching the semiconductor substrate 10 when formed of a silicon material.

Typically and preferably, each of the pair of isolation trenches 17a and 17b is formed to a depth of from about 500 to about 5000 angstroms within the etched semiconductor substrate 10'.

Figure 3:
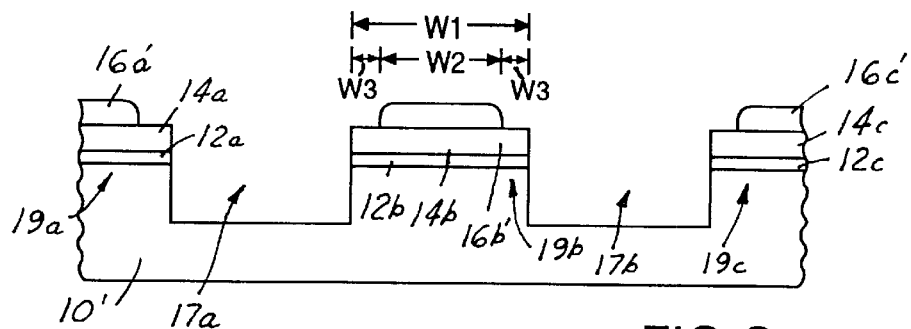

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein the series of patterned silicon nitride layers 16a, 16b and 16c has been vertically and (more particularly) laterally etched to form a series of laterally etched patterned silicon nitride layers 16a', 16b' and 16c'.

Within the preferred embodiment of the present invention, the series of patterned silicon nitride layers 16a, 16b and 16c may in particular be laterally etched to form the series of laterally etched patterned silicon nitride layers 16a', 16b' and 16c' incident to isotropic etching within an isotropic etchant, such as in particular an elevated temperature phosphoric acid isotropic etchant.

As is illustrated within the schematic cross-sectional diagram of FIG. 3, the laterally etched patterned silicon nitride layer 16b' is laterally etched to a linewidth W2 of from about 0.2 to about 0.4 microns, which provides a pair of lateral recesses of linewidth W3 from about 0.05 to about 0.1 microns separating the laterally etched patterned silicon nitride layer 16b' from the pair of isolation trenches 17a and 17b. In comparison, the remaining and original linewidth W1 of the patterned polysilicon buffer layer 14b is still from about 0.3 to about 0.5 microns.

Figure 4:
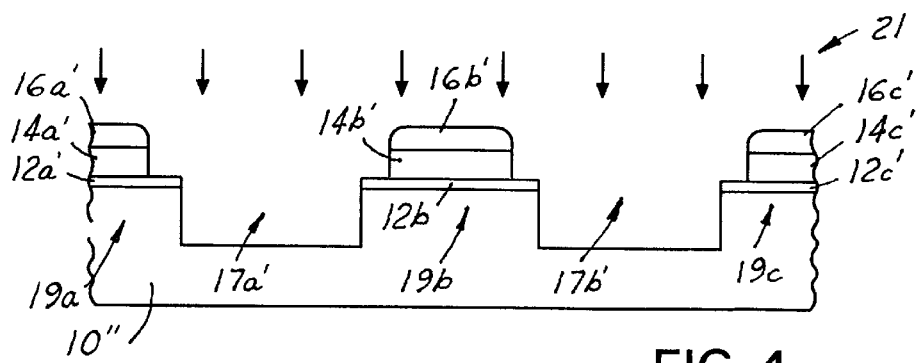

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein the series of patterned polysilicon buffer layers 14a, 14b and 14c has been further anisotropically patterned, while employing a second etching plasma 21 and while employing the series of laterally etched patterned silicon nitride layers 16a', 16b' and 16c' as a series of etch mask layers, to form a series of twice patterned polysilicon buffer layers 14a', 14b' and 14c'.

Within the preferred embodiment of the present invention, the second etching plasma 21 may employ methods and materials analogous or equivalent to the methods and materials employed for forming the first etching plasma 18 as illustrated within the schematic cross-sectional diagram of FIG. 2. Under such circumstances, and as is illustrated within the schematic cross-sectional diagram of FIG. 4, it is also common in the art for the pair of isolation trenches 17a and 17b within the etched semiconductor substrate 10' to be somewhat further etched in depth to form a pair of further etched isolation trenches 17a' and 17b' within a further etched semiconductor substrate 10".

As is understood by a person skilled in the art, the series of laterally etched patterned silicon nitride layers 16a', 16b' and 16c' and the series of twice patterned polysilicon buffer layers 14a', 14b' and 14c' in an aggregate form a series of laterally etched mask layers in accord with the present invention. The series of laterally etched mask layers is laterally recessed from the pair of further etched isolation trenches 17a' and 17b' by the lateral recess linewidth W3 as illustrated within the schematic cross-sectional diagram of FIG. 3.

Figure 5:
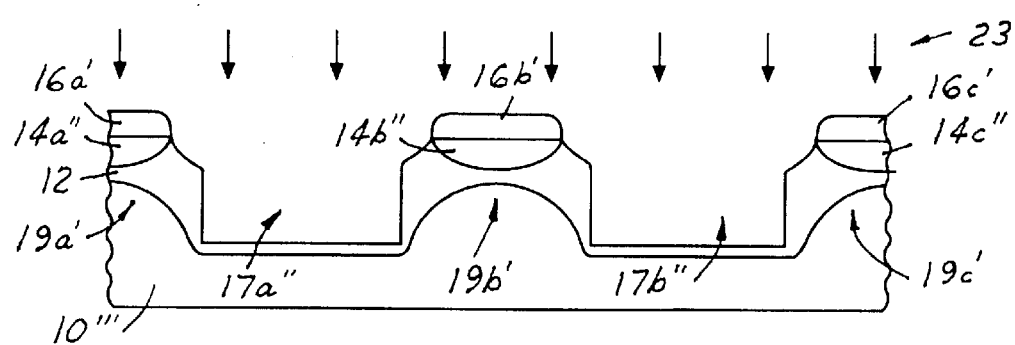

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein the semiconductor integrated circuit microelectronic fabrication has been thermally annealed within a thermal oxidizing atmosphere 23 to form, in a first instance, from the further etched semiconductor substrate 10" a thermally oxidized further etched semiconductor substrate 10'". The thermally oxidized further etched semiconductor substrate 10'" in turn has formed thereupon a contiguous thermal silicon oxide liner layer 12 which has incorporated therein the series of patterned pad oxide layers 12a, 12b and 12c. Similarly, the contiguous thermal silicon oxide liner layer 12 is formed incident to: (1) partial consumption of the further etched semiconductor substrate 10" when forming the thermally oxidized further etched semiconductor substrate 10'"; as well as (2) partial consumption of the series of twice patterned polysilicon buffer layers 14a', 14b' and 14c' which form a series of thermally oxidized twice patterned polysilicon buffer layers 14a", 14b" and 14c".

As is finally illustrated within the schematic cross-sectional diagram of FIG. 5, there is formed from the pair of further etched isolation trenches 17a' and 17b' a pair of thermally oxidized further etched isolation trenches 17a' and 17b" and formed from the series of elevated plateaus 19a, 19b and 19c a series of continuously curved convex elevated regions 19a', 19b' and 19c'.

Within the preferred embodiment of the present invention, typically and preferably, the thermal oxidizing atmosphere 23 contains oxygen or an alternative oxidant at a temperature of from about 800 to about 1100 degrees centigrade for a time period of from about 10 to about 100 minutes.

Significant to the present invention, is that incident to: (1) the presence of the lateral recesses of linewidths W3 for the bilayer mask layers separation from the pair of further etched isolation trenches 17a' and 17b'; as well as (2) the presence of the twice patterned polysilicon buffer layers 14a', 14b' and 14c' within the bilayer mask layers, the continuously curved convex elevated regions 19a', 19b' and 19c' are more readily formed with an optimal convex curvature in accord with the present invention.

Figure 6:
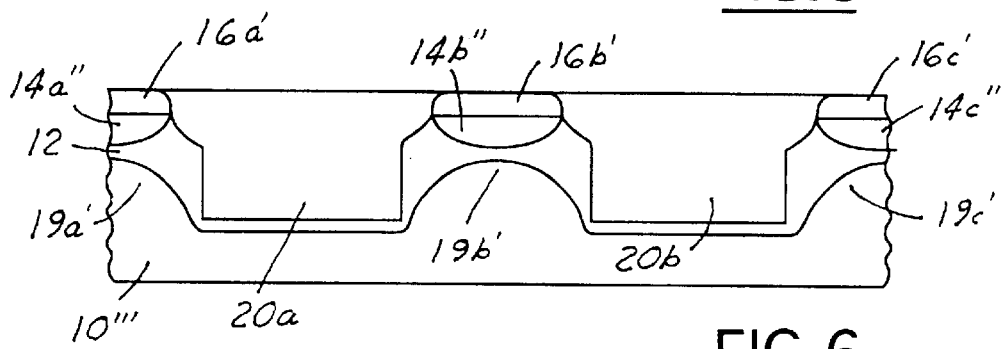

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein there is formed within the pair of thermally oxidized further etched isolation trenches 17a' and 17b" a pair of isolation regions 20a and 20b.

Within the preferred embodiment of the present invention, the pair of isolation regions 20a and 20b may be formed employing methods and materials as are otherwise conventional in the art of semiconductor integrated circuit microelectronic fabrication. Typically and preferably the pair of isolation regions 20a and 20b is formed of a silicon oxide isolation dielectric material typically and preferably formed in part employing a chemical mechanical polish (CMP) planarizing method.

Figure 7:
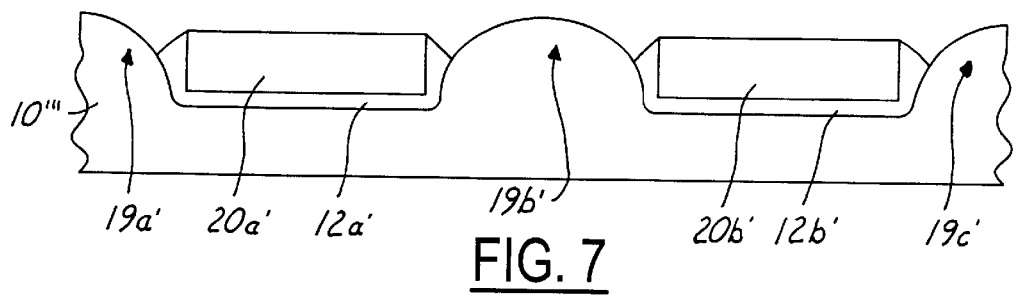

Referring now to FIG. 7, there is shown a schematic cross-sectional diagram illustrating the results of further processing of the semiconductor integrated circuit microelectronic fabrication whose schematic cross-sectional diagram is illustrated in FIG. 6.

Shown in FIG. 7 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 6, but wherein, in a first instance, there is sequentially stripped from the semiconductor integrated circuit microelectronic fabrication: (1) the series of laterally etched patterned silicon nitride layers 16a', 16b' and 16c'; and (2) the series of thermally oxidized twice patterned polysilicon buffer layers 14a", 14b" and 14c". The foregoing two series of patterned layers may typically and preferably be sequentially stripped from the semiconductor integrated circuit microelectronic fabrication whose schematic cross-sectional diagram is illustrated in FIG. 6 to provide in part the semiconductor integrated circuit microelectronic fabrication whose schematic cross-sectional diagram is illustrated in FIG. 7 while employing wet chemical stripping methods as are otherwise generally conventional in the art of semiconductor integrated circuit microelectronic fabrication.

As is finally illustrated within the schematic cross-sectional diagram of FIG. 7, there is: (1) etched back the pair of isolation regions 20a and 20b to form a pair of etched isolation regions 20a' and 20b'; and (2) etched the contiguous thermal silicon oxide liner layer 12 to form a pair of patterned thermal silicon oxide liner layers 12a' and 12b'. The foregoing etching back and patterning may be undertaken employing methods and materials as are conventional in the art of semiconductor integrated circuit microelectronic fabrication, which will typically and preferably employ hydrofluoric acid containing isotropic etchant methods and materials.

Figure 8:
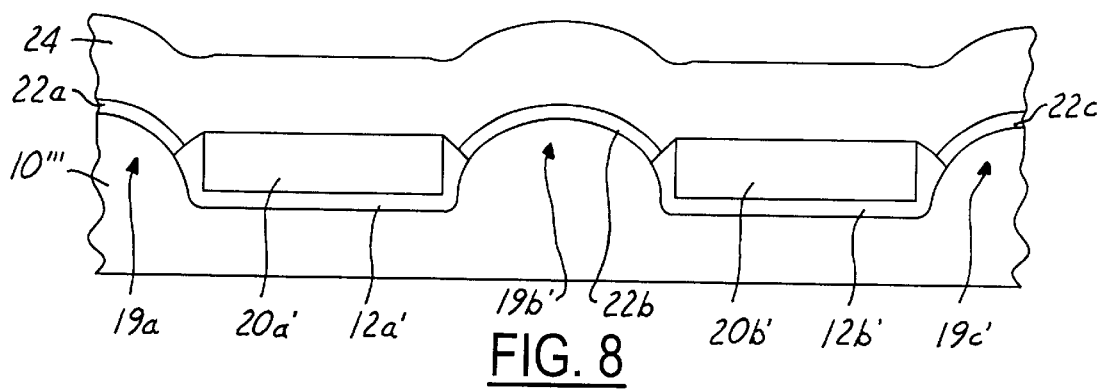

Referring now to FIG. 8, there is shown a schematic cross-sectional diagram illustrating the results of further processing of the semiconductor integrated circuit microelectronic fabrication whose schematic cross-sectional diagram is illustrated in FIG. 7.

Shown in FIG. 8 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 7, but wherein, in a first instance, there is formed upon the series of continuously curved convex elevated regions 19a', 19b' and 19c' (which serve as a series of active regions of the thermally oxidized further etched semiconductor substrate 10''') a series of gate dielectric layers 22a, 22b and 22c.

Within the preferred embodiment of the present invention, the series of gate dielectric layers 22a, 22b and 22c may be formed employing methods and materials as are conventional in the art of semiconductor integrated circuit microelectronic fabrication, including in particular thermal oxidation methods. Typically and preferably, each of the series of gate dielectric layers 22a, 22b and 22c is formed to a thickness of from about 10 to about 200 angstroms.

Finally, there is also shown within the schematic cross-sectional diagram of FIG. 8 formed upon exposed portions of the series of gate dielectric layers 22a, 22b and 22c, the pair of patterned thermal silicon oxide liner layers 12a' and 12b' and the pair of etched isolation regions 20a' and 20b' a gate electrode 24.

Within the preferred embodiment of the present invention,

Within the preferred embodiment of the present invention, the gate electrode 24 may be formed employing methods and materials as are conventional in the art of semiconductor integrated circuit microelectronic fabrication. Typically and preferably, the gate electrode 24 is formed of a doped polysilicon material, having a conventional dopant concentration.

Figure 9:
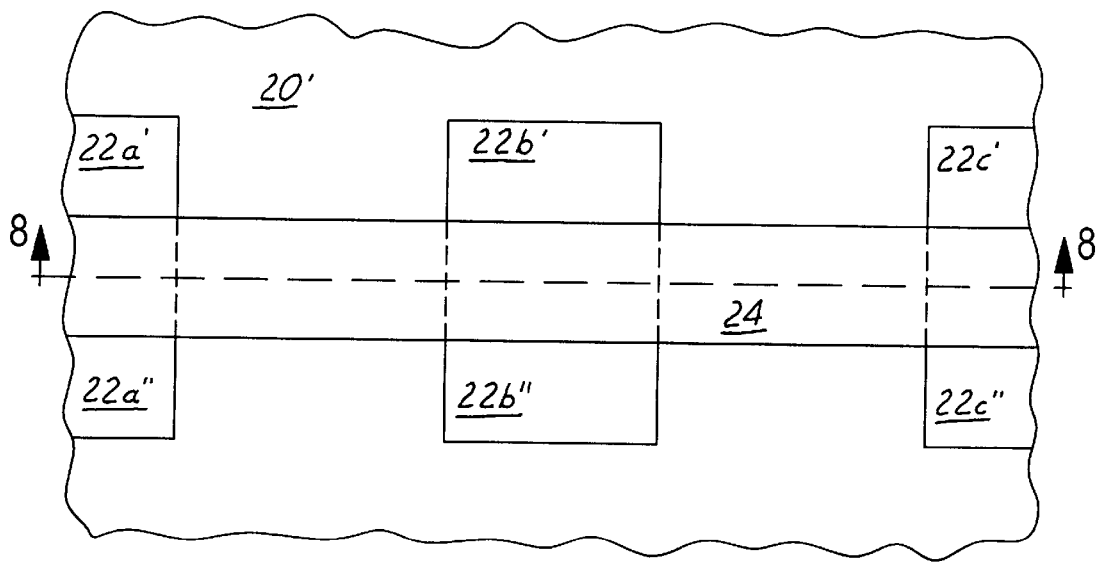

Referring now to FIG. 9, there is shown a schematic plan-view diagram corresponding with the schematic cross-sectional diagram of FIG. 8.

Shown in FIG. 9 is an etched isolation region 20 which corresponds with the pair of etched isolation regions 20a' and 20b'. Shown also within the schematic plan-view diagram of FIG. 9 is a series of gate dielectric layers 22a', 22a", 22b', 22b", 22c' and 22c" which correspond with the series of gate dielectric layers 22a, 22b and 22c, which in turn are formed upon the series of continuously curved convex elevated regions 19a', 19b' and 19c' and where the series of gate dielectric layers 22a, 22b and 22c has formed in part traversing thereupon the gate electrode 24. Within the schematic plan view diagram of FIG. 9, exposed portions of the pair of patterned thermal silicon oxide liner layers 12a' and 12b' have been omitted for clarity, but they nonetheless encircle the series of gate dielectric layers 22a', 22a", 22b', 22b", 22c' and 22c". Similarly, and as is also understood by a person skilled in the art, there is formed into portions of the continuously curved convex elevated regions 19a',19b' and 19c' beneath the series of gate dielectric layers 22a, 22b and 22c and not covered by the gate electrode 24 a series of source/drain regions, while employing methods, and in particular ion implantation methods, as are generally conventional in the art of semiconductor integrated circuit microelectronic fabrication.

As is understood by a person skilled in the art, when portions of the continuously curved convex elevated regions 19a', 19b' and 19c' formed beneath corresponding pairs of gate dielectric layers 22a' and 22a", 22b' and 22b" or 22c' and 22c" (i.e., source/drain regions) are formed of the same dopant polarity, there is formed a series of three field effect transistor (FET) devices. Similarly, when portions of the continuously curved convex elevated regions 19a', 19b' and 19c' formed beneath corresponding pairs of gate dielectric layers 22a' and 22a", 22b' and 22b" and 22c' and 22c" are formed of opposite dopant polarity (i.e., a pair of source/drain regions within an individual isolated device are formed of opposite polarity) there is formed a series of three field effect diode type devices in accord with the schematic plan view diagram of FIG. 9.

Thus there is formed in accord with the preferred embodiment of the present invention as illustrated within the schematic plan-view diagram of FIG. 8, a series of field effect transistor devices, such as in particular field effect transistor (FET) devices, within and upon the continuously curved convex elevated regions 19a', 19b' and 19c' of the thermally oxidized further etched semiconductor substrate 10''', although other semiconductor devices, including but not limited to other semiconductor field effect devices, may alternatively be formed.

Within the present invention, the field effect devices so formed are formed with enhanced performance insofar as they are formed within the continuously curved convex elevated regions. In that regard, the continuously curved convex elevated regions provide: (1) an enhanced field effect device width; (2) a smooth surface topography; (3) reduced junction leakage incident to tangential source/drain implantation at isolation region edges; and (4) increased depletion distances to isolation regions.

As is understood by a person skilled in the art, the preferred embodiment of the present invention is illustrative of the present invention rather than limiting of the present invention. Revisions and modifications may be made to methods, materials, structures and dimensions in accord with the preferred embodiment of the present invention, while still providing a method in accord with the present invention, further in accord with the accompanying claims.

What is claimed is:

1. A method for fabricating a semiconductor substrate comprising:

providing a semiconductor substrate;

forming over the semiconductor substrate a mask layer;

etching the semiconductor substrate while employing the mask layer as an etch mask layer to form an elevated plateau within an etched semiconductor substrate which separates a pair of isolation trenches within the etched semiconductor substrate;

laterally etching the mask layer to form a laterally etched mask layer formed over the elevated plateau and laterally recessed from the pair of isolation trenches;

thermally oxidizing the etched semiconductor substrate while employing the laterally etched mask layer as an oxidation mask layer to form from the elevated plateau a continuously curved convex elevated region formed within a thermally oxidized etched semiconductor substrate.

2. The method of claim 1 wherein the semiconductor substrate is a silicon semiconductor substrate.

3. The method of claim 1 wherein the semiconductor substrate is a germanium semiconductor substrate.

4. The method of claim 1 wherein the semiconductor substrate is a silicon-germanium alloy semiconductor substrate.

5. The method of claim 1 wherein each of the pair of isolation trenches is formed to a depth of from about 500 to about 5000 angstroms within the etched semiconductor substrate.

6. The method of claim 1 wherein the elevated plateau has a linewidth of from about 0.3 to about 0.5 microns.

7. The method of claim 6 wherein:

the laterally etched mask layer has a linewidth of from about 0.2 to about 0.4 microns; and the laterally etched mask layer has a pair of lateral recesses of linewidth from about 0.05 to about 0.1 microns each with respect to the pair of isolation trenches.

8. The method of claim 1 wherein the mask layer is formed of a silicon nitride material layer.

9. The method of claim 1 wherein the mask layer is formed of a polysilicon buffer material layer having formed thereupon a silicon nitride material layer.

10. The method of claim 9 wherein by employing the polysilicon buffer material layer, the continuously curved convex elevated region is formed with enhanced curvature.

11. The method of claim 1 further comprising forming within and upon the continuously curved convex elevated region a semiconductor device.

12. The method of claim 11 wherein the semiconductor device is a field effect device.

13. The method of claim 12 wherein the field effect device is a field effect transistor (FET) device.

14. The method of claim 12 wherein the field effect device is a field effect diode device.

15. A method for fabricating a semiconductor substrate comprising:

providing a semiconductor substrate;

forming over the semiconductor substrate a mask layer;

etching the semiconductor substrate while employing the mask layer as an etch mask layer to form an elevated plateau within an etched semiconductor substrate which separates a pair of isolation trenches within the etched semiconductor substrate;

laterally etching the mask layer to form a laterally etched mask layer formed over the elevated plateau and laterally recessed from the pair of isolation trenches;

thermally oxidizing the etched semiconductor substrate while employing the laterally etched mask layer as an oxidation mask layer to form from the elevated plateau a continuously curved convex elevated region formed within a thermally oxidized etched semiconductor substrate, wherein by laterally etching the mask layer to form the laterally etched mask layer laterally recessed from the pair of isolation trenches, the continuously curved convex elevated region is formed with enhanced curvature.

16. The method of claim 15 wherein the mask layer is formed of a silicon nitride material layer.

17. The method of claim 15 wherein the mask layer is formed of a polysilicon buffer material layer having formed thereupon a silicon nitride material layer.

18. The method of claim 16 wherein by employing the polysilicon buffer material layer, the continuously curved convex elevated region is formed with enhanced curvature.

* * * * *